(12) United States Patent
Chang et al.

(10) Patent No.: US 12,174,446 B2
(45) Date of Patent: Dec. 24, 2024

(54) SENSOR LENS ASSEMBLY HAVING NON-SOLDERING CONFIGURATION (71) Applicant: KINGPAK TECHNOLOGY INC., Hsin-Chu County (TW)

(72) Inventors: Chia-Shuai Chang, Hsin-Chu County (TW); Chien-Chen Lee, Hsin-Chu County (TW); Li-Chun Hung, Hsin-Chu County (TW); Chien-Yuan Wang, Hsin-Chu County (TW)

(73) Assignee: TONG HSING ELECTRONIC INDUSTRIES, LTD., Taipei (TW)

( * ) Notice: Subject to any disclaimer, the term of this patent is extended or adjusted under 35 U.S.C. 154(b) by 534 days.

(21) Appl. No.: 17/688,976

(22) Filed: Mar. 8, 2022

(65) Prior Publication Data

US 2022/0390703 A1 Dec. 8, 2022

Related U.S. Application Data (60) Provisional application No. 63/196,685, filed on Jun. 4, 2021.

(30) Foreign Application Priority Data

Dec. 6, 2021 (TW) ................... 110145384

(51) Int. Cl.
*G02B 7/02* (2021.01)
*H04N 23/54* (2023.01)
*H04N 23/55* (2023.01)
*H05K 1/18* (2006.01)

(52) U.S. Cl.
CPC ............. *G02B 7/021* (2013.01); *H04N 23/54* (2023.01); *H04N 23/55* (2023.01); *H05K 1/181* (2013.01)

(58) Field of Classification Search
None
See application file for complete search history.

(56) References Cited

U.S. PATENT DOCUMENTS 9,608,029 B2   3/2017  Wong
12,108,517 B2 * 10/2024  Chang ................. H05K 1/0274

FOREIGN PATENT DOCUMENTS

CN   107395938 A   11/2017
CN   110957334 A   4/2020

* cited by examiner

*Primary Examiner* — Robert K Carpenter
(74) *Attorney, Agent, or Firm* — Li & Cai Intellectual Property (USA) Office (57) ABSTRACT

A sensor lens assembly having a non-soldering configuration is provided. The sensor lens assembly includes a circuit board, an optical module fixed on the circuit board, a sensor chip assembled to the circuit board, a plurality of wires electrically coupled to the sensor chip and the circuit board, and a cover that overcovers the sensor chip and the wires. The cover includes a light-permeable sheet and an opaque frame. The light-permeable sheet has a ring-shaped notch recessed in an edge of an inner surface thereof. The opaque frame is formed on the ring-shaped notch and is disposed on the circuit board, the light-permeable sheet and the sensor chip are spaced apart from each other, and the sensor chip and the wires are arranged in a space that is defined by the light-permeable sheet and the opaque frame.

10 Claims, 9 Drawing Sheets

SENSOR LENS ASSEMBLY HAVING NON-SOLDERING CONFIGURATION

CROSS-REFERENCE TO RELATED PATENT APPLICATION

This application claims the benefit of priority to Taiwan Patent Application No. 110145384, filed on Dec. 6, 2021. The entire content of the above identified application is incorporated herein by reference.

This application claims the benefit of priority to the U.S. Provisional Patent Application Ser. No. 63/196,685 filed on Jun. 4, 2021, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a sensor lens assembly, and more particularly to a sensor lens assembly having a non-soldering configuration.

BACKGROUND OF THE DISCLOSURE

A conventional sensor lens assembly is manufactured by fixing a sensor package structure onto a circuit board through a soldering process and then assembling an optical module to the circuit board. However, a structural configuration of the conventional sensor lens assembly is limited by the sensor package structure, so that the structural configuration of the conventional sensor lens assembly is difficult to be improved. For example, since the sensor package structure of the conventional sensor lens assembly needs to undergo the soldering process for being fixed onto the circuit board, the connection between any two components of the sensor package structure must be capable of resisting high temperature.

SUMMARY OF THE DISCLOSURE

In response to the above-referenced technical inadequacy, the present disclosure provides a sensor lens assembly having a non-soldering configuration to effectively improve on the issues associated with conventional sensor lens assemblies.

In one aspect, the present disclosure provides a sensor lens assembly having a non-soldering configuration. The sensor lens assembly includes a circuit board, an optical module, a sensor chip, a plurality of wires, and a cover. The circuit board has a first surface and a second surface that is opposite to the first surface. The first surface of the circuit board includes a chip-bonding region and a plurality of bonding pads that are arranged outside of the chip-bonding region. The optical module includes a frame, at least one lens, and a filtering sheet. The frame is fixed on the first surface of the circuit board. The at least one lens is assembled into the frame, and a central axis of the at least one lens passes through the chip-bonding region. The filtering sheet is assembled into the frame and is positioned along the central axis. The frame and the filtering sheet jointly define a distribution space, and the chip-bonding region and the bonding pads are arranged in the distribution space. The sensor chip includes a sensing region arranged on a top surface thereof and a plurality of connection pads that are arranged on the top surface and outside of the sensing region. The sensor chip is disposed on the chip-bonding region, and the sensing region is positioned along the central axis. The bonding pads are respectively and electrically coupled to the connection pads through the wires. The cover is arranged in the distribution space and includes a light-permeable sheet and an opaque frame. The light-permeable sheet has two anti-reflection films that are respectively coated on two opposite sides thereof and that respectively define an inner surface and an outer surface. The light-permeable sheet has a ring-shaped notch recessed in an edge of the inner surface, and the two anti-reflection films are not arranged in the ring-shaped notch. The opaque frame is formed on the ring-shaped notch. The opaque frame is disposed on the first surface of the circuit board, the light-permeable sheet and the sensor chip are spaced apart from each other, and the sensor chip and the wires are arranged in a space that is defined by the light-permeable sheet and the opaque frame, and wherein the opaque frame does not cover the inner surface of the light-permeable sheet.

In another aspect, the present disclosure provides a sensor lens assembly having a non-soldering configuration. The sensor lens assembly includes a circuit board, an optical module, a sensor chip, a plurality of wires, and a cover. The circuit board has a first surface and a second surface that is opposite to the first surface. The first surface of the circuit board includes a chip-bonding region and a plurality of bonding pads that are arranged outside of the chip-bonding region. The optical module includes a frame, at least one lens, and a filtering sheet. The frame is fixed on the first surface of the circuit board. The at least one lens is assembled into the frame, and a central axis of the at least one lens passes through the chip-bonding region. The filtering sheet is assembled into the frame and is positioned along the central axis. The frame and the filtering sheet jointly define a distribution space, and the chip-bonding region and the bonding pads are arranged in the distribution space. The sensor chip includes a sensing region arranged on a top surface thereof and a plurality of connection pads that are arranged on the top surface and outside of the sensing region. The sensor chip is disposed on the chip-bonding region, and the sensing region is positioned along the central axis. The bonding pads are respectively and electrically coupled to the connection pads through the wires. The cover is arranged in the distribution space and includes a light-permeable sheet, a light shielding film, and an opaque frame. The light-permeable sheet has two anti-reflection films that are respectively coated on two opposite sides thereof and that respectively define an inner surface and an outer surface. The light shielding film is in a ringed shape and is disposed on the inner surface. The light shielding film includes a shielding segment and an embedded segment that surrounds the shielding segment. The inner surface is divided into a light-permeable region and a formation region by the light shielding film. The light-permeable region is arranged inside of the light shielding film, and the formation region is arranged outside of the light shielding film. The opaque frame is formed on the embedded segment and the formation region. The opaque frame is disposed on the first surface of the circuit board, the light-permeable sheet and the sensor chip are spaced apart from each other, and the sensor chip and the wires are arranged in a space that is defined by the light-permeable sheet and the opaque frame.

Therefore, through cooperation of the above components, the sensor lens assembly provided by the present disclosure does not need to undergo any soldering process through the non-soldering configuration thereof, such that requirements for high-temperature resistance of component connections in the distribution space (e.g., connections between any two of the sensor chip, the wires, the cover, and the sealing compound) can be lowered. Accordingly, a material cost of the sensor lens assembly can be decreased, and the product yield of the sensor lens assembly can be increased. Specifically, since the sensor lens assembly of the present disclosure does not need to go through a soldering process, the sensor lens assembly does not need to be subjected to relevant testing processes, thereby effectively simplifying the entire production process to improve the production efficiency of the sensor lens assembly.

Moreover, the light-permeable sheet of the sensor lens assembly provided by the present disclosure is in cooperation with the opaque frame through the ring-shaped notch, thereby effectively reducing a probability of a fluid (e.g., the sealing compound or moist) flowing into the cover by passing through connection between the light-permeable sheet and the opaque frame.

In addition, the sensor lens assembly provided by the present disclosure can accurately define the light-permeable region from the inner surface by forming the light shielding film onto the inner surface, and the light shielding film can effectively block light from passing therethrough so as to avoid occurrence of a flare phenomenon. Moreover, during a forming process of the opaque frame, the light shielding film can be pressed by and gaplessly connected to a mold through having a resilient property, thereby blocking the opaque frame from extending to the light-permeable region so that the opaque frame can be precisely formed.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 1:
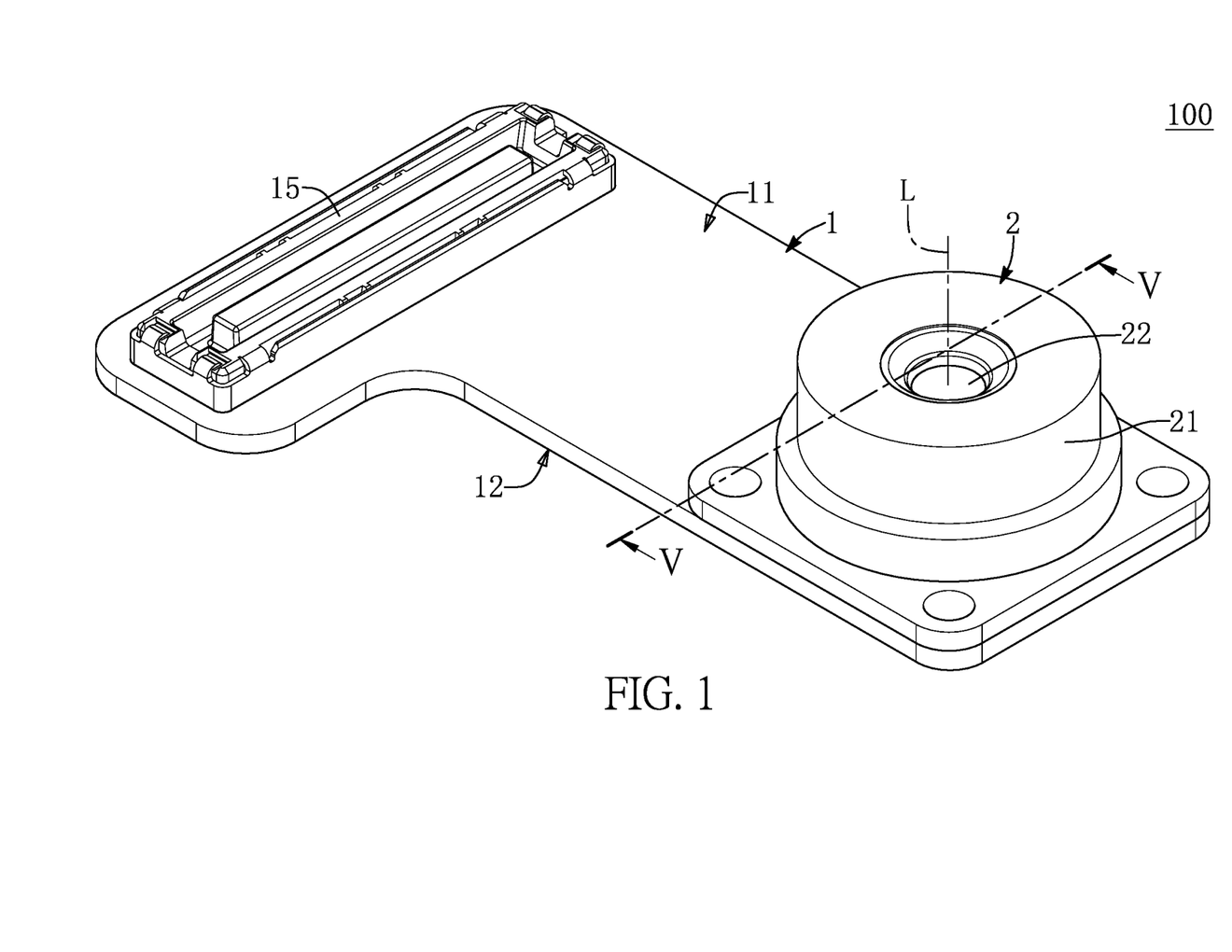
FIG. 1 is a perspective view of a sensor lens assembly having a non-soldering configuration according to a first embodiment of the present disclosure.
Figure 2:
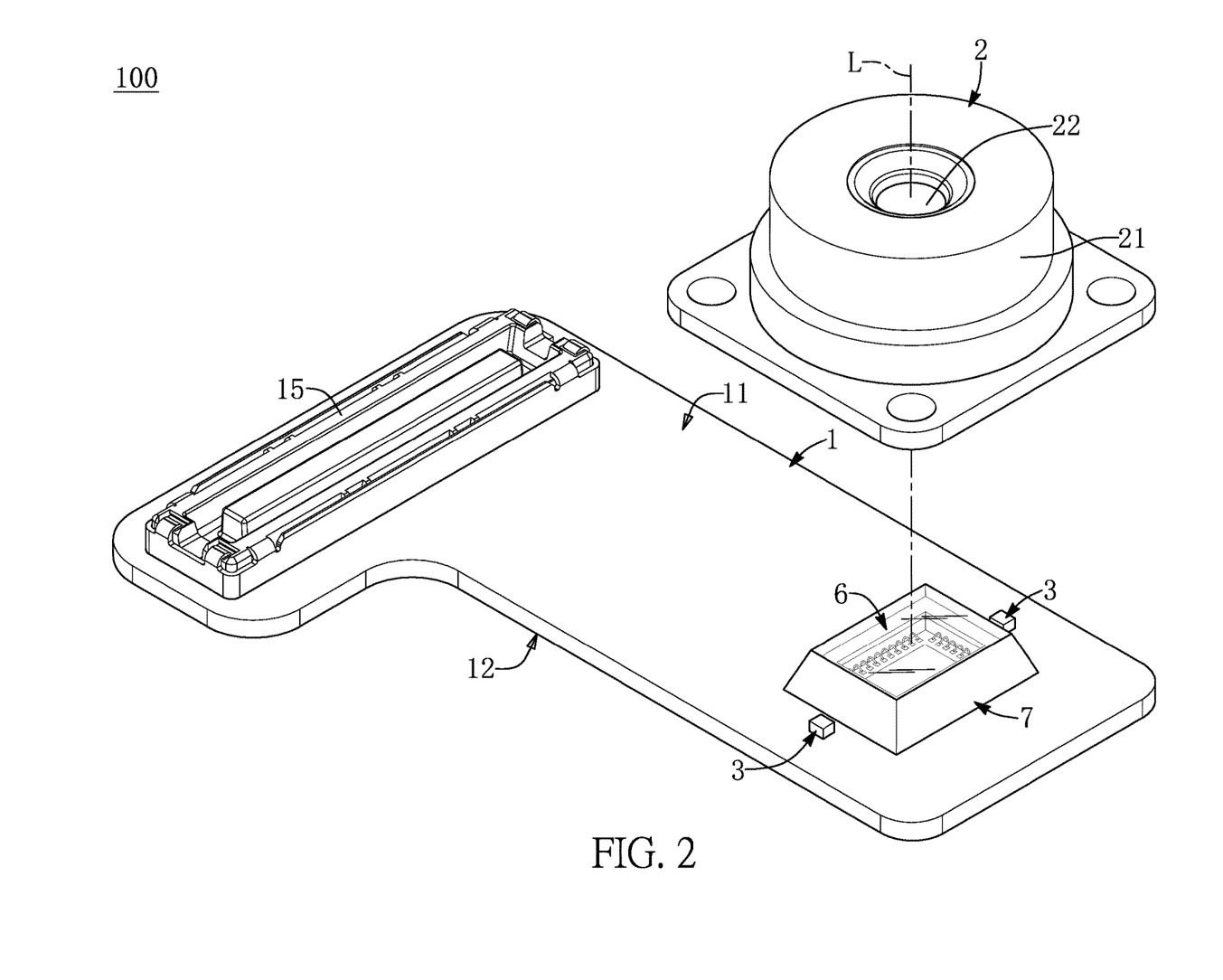
FIG. 2 is an exploded view of FIG. 1.

Referring to FIG. 1 to FIG. 5, a first embodiment of the present disclosure provides a sensor lens assembly 100 having a non-soldering configuration. As shown in FIG. 1 and FIG. 2, the sensor lens assembly 100 of the present embodiment does not have any package structure therein. In other words, any sensor lens assembly which has a package structure or is formed by implementing a soldering process is different from the sensor lens assembly 100 of the present embodiment.

Figure 3:
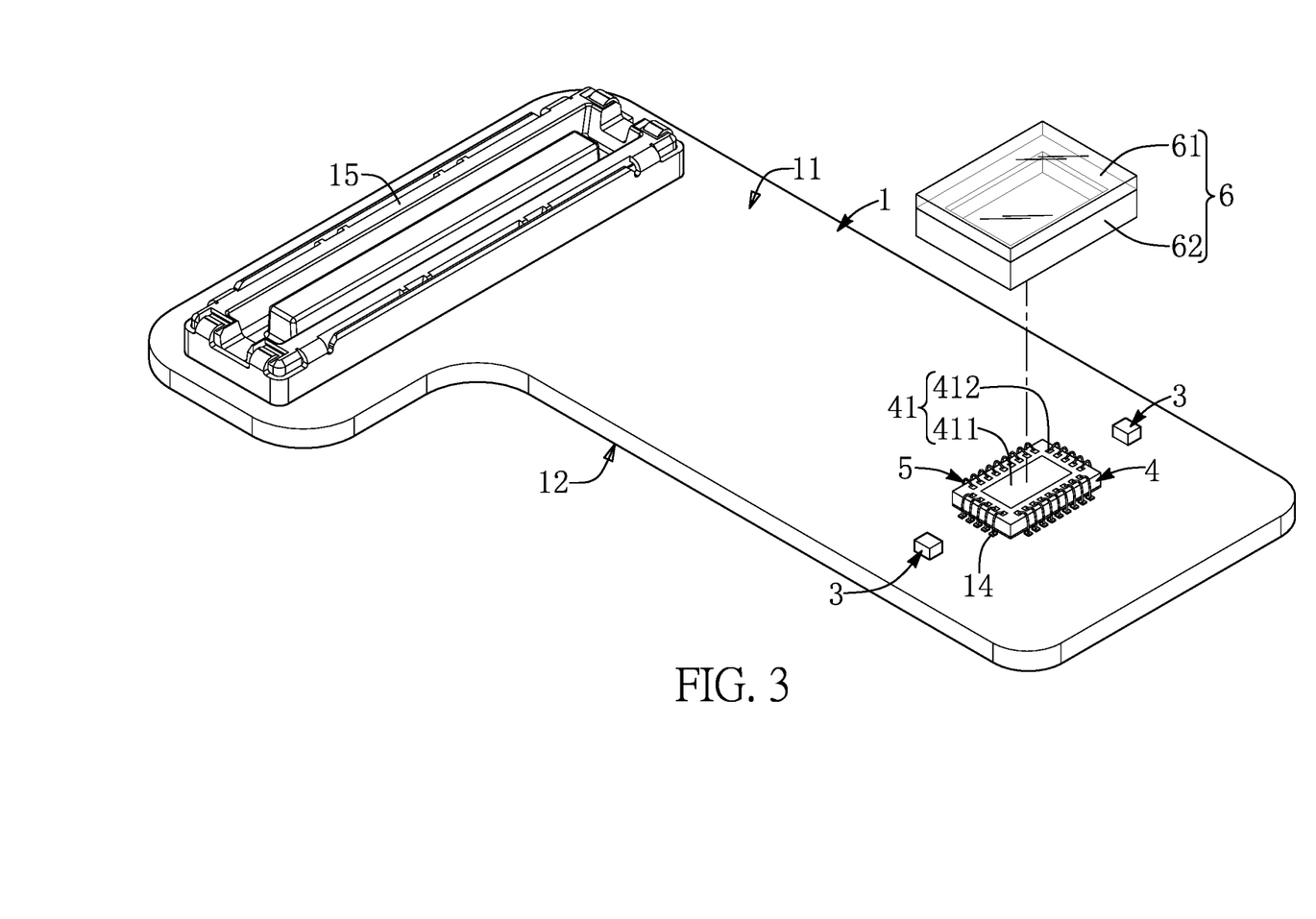
FIG. 3 is a partial exploded view of FIG. 2 when an optical module and a sealing compound are omitted.
Figure 4:
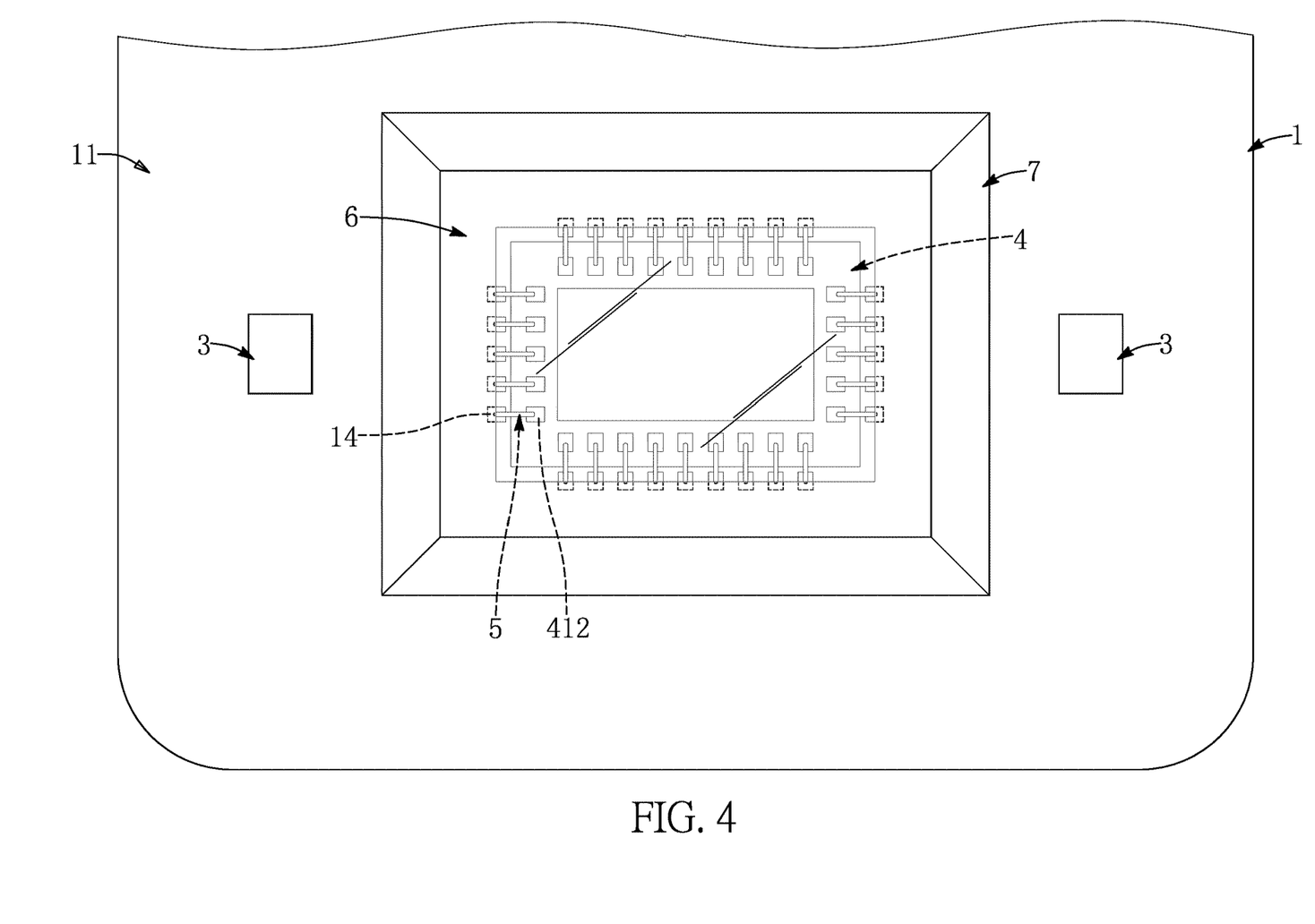
FIG. 4 is a partial top view of FIG. 2 when the optical module is omitted.

As shown in FIG. 3 and FIG. 4, the sensor lens assembly 100 includes a circuit board 1, an optical module 2 fixed to the circuit board 1, at least one passive electronic component 3 assembled to the circuit board 1, a sensor chip 4 assembled to the circuit board 1, a plurality of wires 5 electrically coupling the sensor chip 4 and the circuit board 1, a cover 6 overcovering the sensor chip 4 and the wires 5, and a sealing compound 7.

The sensor lens assembly 100 in the present embodiment is described by including the above components, but the sensor lens assembly 100 can be adjusted or changed according to design requirements. For example, in other embodiments of the present disclosure not shown in the drawings, the sensor lens assembly 100 can be provided by omitting at least one of the sealing compound 7 and the at least one passive electronic component 3.

The circuit board 1 in the present embodiment can be a printed circuit board (PCB) or a flexible printed circuit (FPC), but the present disclosure is not limited thereto. The circuit board 1 has a first surface 11 and a second surface 12 that is opposite to the first surface 11. The circuit board 1 has no slot recessed in the first surface 11, and the circuit board 1 includes a chip-bonding region 13 arranged on the first surface 11 and a plurality of bonding pads 14 that are arranged on the first surface 11 and outside of the chip-bonding region 13.

In addition, as shown in FIG. 1 and FIG. 2, the circuit board 1 can be provided with an electrical connector 15. The circuit board 1 is configured to be detachably connected to an electronic device (not shown in the drawings) through the electrical connector 15, so that the sensor lens assembly 100 can be assembled and electrically connected to the electronic device.

Figure 5:
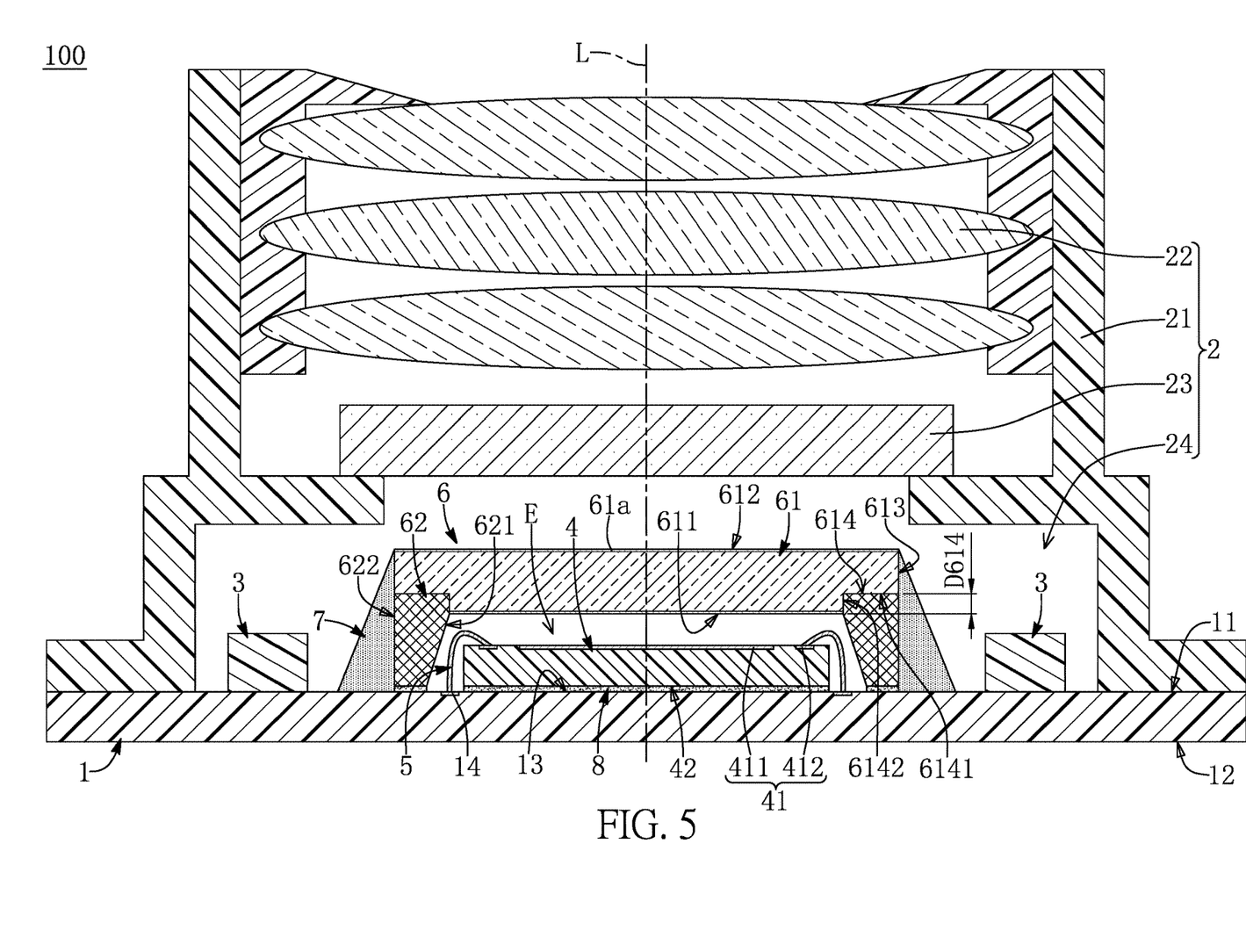
FIG. 5 is a cross-sectional view taken along line V-V of FIG. 1.

As shown in FIG. 4 and FIG. 5, the optical module 2 includes a frame 21, at least one lens 22 assembled into the frame 21, and a filtering sheet 23 assembled into the frame 21. A bottom of the frame 21 is fixed to the first surface 11 of the circuit board 1, a central axis L of the at least one lens 22 passes through the chip-bonding region 13, and the filtering sheet 23 is positioned along the central axis L. The at least one passive electronic component 3 is assembled to the first surface 11 of the circuit board 1 and is arranged adjacent to the frame 21. Moreover, a quantity of the at least one passive electronic component 3 can be adjusted or changed according to design requirements, and outer lateral edges of the circuit board 1 can be partially flush with the frame 21 (e.g., three of the outer lateral edges of the circuit board 1 are flush with the frame 21), but the present disclosure is not limited thereto.

Specifically, a quantity of the at least one lens 22 in the present embodiment is more than one, the central axes L of the multiple ones of the lens 22 overlap with each other, and the filtering sheet 23 is located between the lenses 22 and the chip-bonding region 13. The frame 21 and the filtering sheet 23 jointly define a distribution space 24. Moreover, the chip-bonding region 13, the bonding pads 14, the at least one passive electronic component 3, the sensor chip 4, the wires 5, the cover 6, and the sealing compound 7 are arranged in the distribution space 24.

The sensor chip 4 in the present embodiment is an image sensor chip, but the present disclosure is not limited thereto. The sensor chip 4 is disposed on the chip-bonding region 13 of the circuit board 1 (e.g., a bottom surface 42 of the sensor chip 4 faces the chip-bonding region 13), and is positioned along the central axis L.

It should be noted that the sensor lens assembly 100 in the present embodiment includes a chip-bonding adhesive 8, and the sensor chip 4 is fixed to the chip-bonding region 13 through the chip-bonding adhesive 8 (e.g., the bottom surface 42 of the sensor chip 4 is adhered to the chip-bonding region 13 through the chip-bonding adhesive 8), but the present disclosure is not limited thereto. For example, in other embodiments of the present disclosure not shown in the drawings, the chip-bonding adhesive 8 can be omitted or can be replaced by other components.

Moreover, the sensor chip 4 includes a sensing region 411 arranged on a top surface 41 and a plurality of connection pads 412 that are arranged on the top surface 41 and outside of the sensing region 411. The filtering sheet 23 is chosen according to (or corresponding to) the sensing region 411 of the sensor chip 4. For example, when light passes through the at least one lens 22, the filtering sheet 23 is configured to (only) allow the light of a wavelength band corresponding to the sensing region 411 to pass therethrough.

In the present embodiment, the bonding pads 14 are in a ring-shaped arrangement, the connection pads 412 arranged on the top surface 41 surround the sensing region 411 in a substantially ring-shaped arrangement, and the connection pads 412 preferably correspond in position to the bonding pads 14, respectively, but the present disclosure is not limited thereto. For example, in other embodiments of the present disclosure not shown in the drawings, the connection pads 412 can be arranged in two rows that are respectively located at two opposite sides of the sensing region 411, the bonding pads 14 can also be arranged in two rows that are respectively located at two opposite sides of the chip-bonding region 13, and the connection pads 412 can respectively correspond in position to the bonding pads 14.

The wires 5 electrically couple the bonding pads 14 to the connection pads 412, respectively. In other words, each of the wires 5 is formed in a wiring manner, so that two opposite ends of each of the wires 5 are respectively connected to one of the bonding pads 14 and the corresponding connection pad 412.

The cover 6 in the present embodiment is disposed (e.g., adhered) onto the circuit board 1 along a direction perpendicular to the circuit board 1, and the sensor chip 4 and the wires 5 are located in a space surroundingly defined by the cover 6. In other words, the cover 6 and the circuit board 1 jointly define an enclosed space E for accommodating the sensor chip 4 and the wires 5.

The cover 6 includes a light-permeable sheet 61 and an opaque frame 62. The light-permeable sheet 61 in the present embodiment is a transparent and flat glass board, the light-permeable sheet 61 has two anti-reflection films 61a that are respectively coated on two opposite sides thereof and that respectively define an inner surface 611 and an outer surface 612, and the light-permeable sheet 61 can further have a surrounding lateral surface 613 connected to the outer surface 612, but the present disclosure is not limited thereto. For example, in other embodiments of the present disclosure not shown in the drawings, the light-permeable sheet 61 can be made of a light-permeable plastic material.

Specifically, the light-permeable sheet 61 has a ring-shaped notch 614 recessed in an edge of the inner surface 611, and the two anti-reflection films 61a are not arranged in the ring-shaped notch 614. The ring-shaped notch 614 has a longitudinal depth D614 with respect to the inner surface 611, and the longitudinal depth D614 is less than or equal to 50% of a thickness of the light-permeable sheet 61. Moreover, the ring-shaped notch 614 is a ring-shaped step structure and has a ring-shaped tread surface 6141 and a ring-shaped riser surface 6142. The ring-shaped tread surface 6141 is connected to the surrounding lateral surface 613, and the ring-shaped riser surface 6142 connects the ring-shaped tread surface 6141 and the inner surface 611.

The opaque frame 62 is formed on the ring-shaped notch 614 and is disposed on the first surface 11 of the circuit board 1 (i.e., one end of the opaque frame 62 is connected to the ring-shaped notch 614, and another end of the opaque frame 62 is connected to the first surface 11), so that the light-permeable sheet 61 and the sensor chip 4 are spaced apart from each other, and the sensor chip 4 and the wires 5 are arranged in a space that is jointly defined by the light-permeable sheet 61 and the opaque frame 62.

Specifically, the ring-shaped tread surface 6141 and the ring-shaped riser surface 6142 of the light-permeable sheet 61 are entirely covered by the opaque frame 62, and the opaque frame 62 does not cover (or is not in contact with)

the inner surface 611 of the light-permeable sheet 61. The opaque frame 62 has an inside surface 621 and an outside surface 622 that is coplanar with the surrounding lateral surface 613 of the light-permeable sheet 61. The inside surface 621 of the opaque frame 62 is connected to an edge of the ring-shaped riser surface 6142.

The bonding pads 14 are arranged at a projection area defined by orthogonally projecting the ring-shaped riser surface 6142 onto the first surface 11 (i.e., the ring-shaped riser surface 6142 is located directly above the bonding pads 14), and a part of each of the wires 5 is arranged in a projection space defined by orthogonally projecting the inside surface 621 toward the first surface 11 (e.g., the inside surface 621 is slanted relative to the first surface 11, so that the part of each of the wires 5 can be located under the inside surface 621).

The sealing compound 7 covers and is connected to the outside surface 622 of the opaque frame 62 and the surrounding lateral surface 613 of the light-permeable sheet 61, and the outer surface 612 of the light-permeable sheet 61 is exposed from the sealing compound 7. The sealing compound 7 in the present embodiment is located inside of the multiple ones of the passive electronic component 3, but in other embodiments of the present disclosure not shown in the drawings, the sealing compound 7 can cover at least one of the passive electronic components 3.

In summary, through cooperation of the above components, the sensor lens assembly 100 provided by the present embodiment does not need to undergo any soldering process through the non-soldering configuration thereof, such that requirements for high-temperature resistance of component relationships in the distribution space 24 (e.g., connection between any two of the sensor chip 4, the wires 5, the cover 6, and the sealing compound 7) can be lowered. Accordingly, a material cost of the sensor lens assembly 100 can be decreased, and the product yield of the sensor lens assembly 100 can be increased. Specifically, since the sensor lens assembly 100 of the present embodiment does not need to go through a soldering process, the sensor lens assembly 100 does not need to be subjected to relevant testing processes, thereby effectively simplifying the entire production process to improve the production efficiency of the sensor lens assembly 100.

Moreover, the light-permeable sheet 6 of the sensor lens assembly 100 provided by the present embodiment is in cooperation with the opaque frame 62 through the ring-shaped notch 614, thereby effectively reducing a probability of a fluid (e.g., the sealing compound 7 or moist) flowing into the cover 6 by passing through connection between the light-permeable sheet 61 and the opaque frame 62.

Second Embodiment

Figure 6:
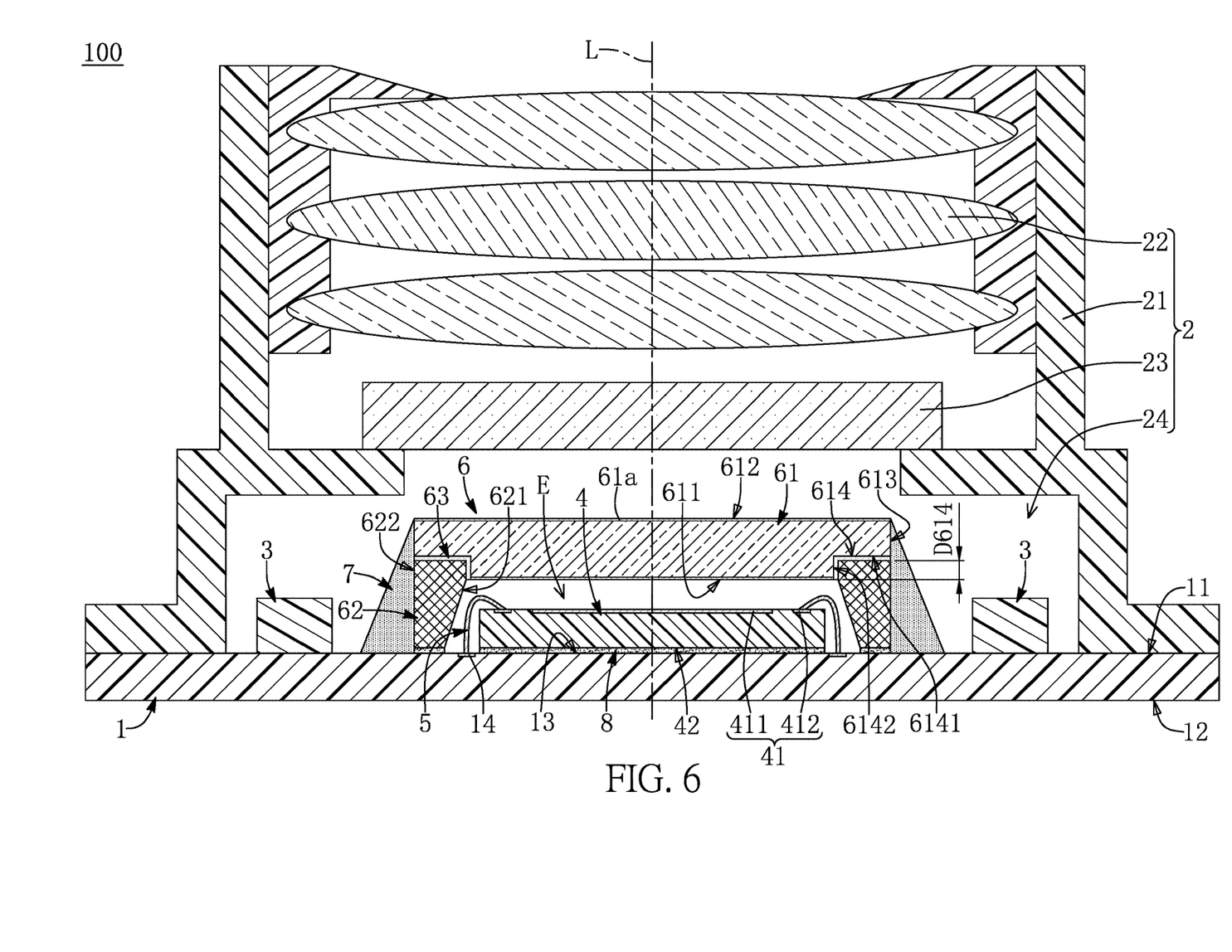
FIG. 6 is a cross-sectional view of the sensor lens assembly according to a second embodiment of the present disclosure.

Referring to FIG. 6, a second embodiment of the present disclosure is provided, which is similar to the first embodiment of the present disclosure. For the sake of brevity, descriptions of the same components in the first and second embodiments of the present disclosure will be omitted herein, and the following description only discloses different features between the first and second embodiments.

In the present embodiment, the sensor lens assembly 100 includes a light shielding film 63 arranged in the ring-shaped notch 614. The ring-shaped tread surface 6141 and the ring-shaped riser surface 6142 are entirely covered by the light shielding film 63, and the light shielding film 63 is entirely covered by the opaque frame 62. In other words, the light shielding film 63 is sandwiched between the ring-shaped notch 614 and the opaque frame 62.

Third Embodiment

Figure 7:
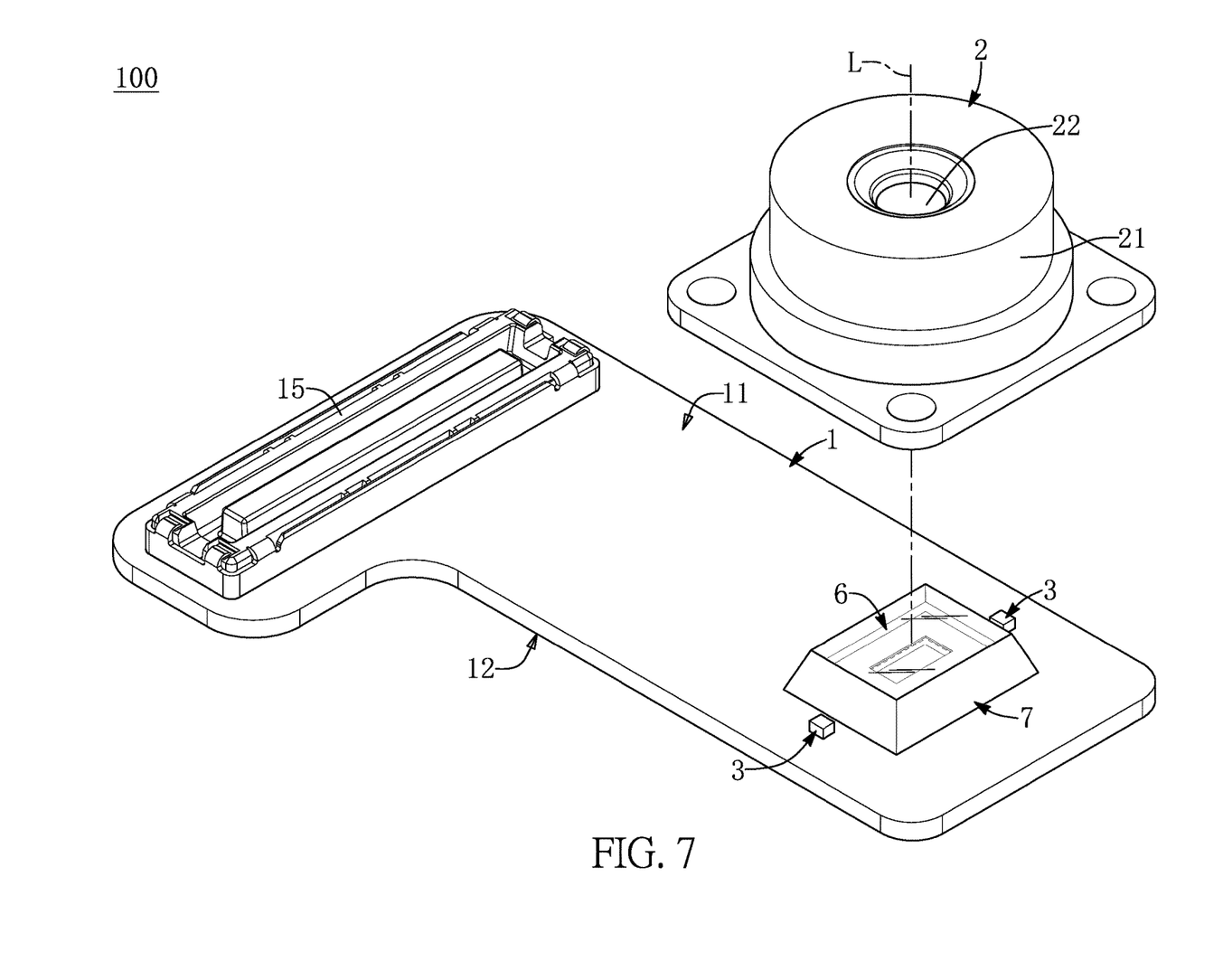
FIG. 7 is an exploded view of the sensor lens assembly according to a third embodiment of the present disclosure.
Figure 8:
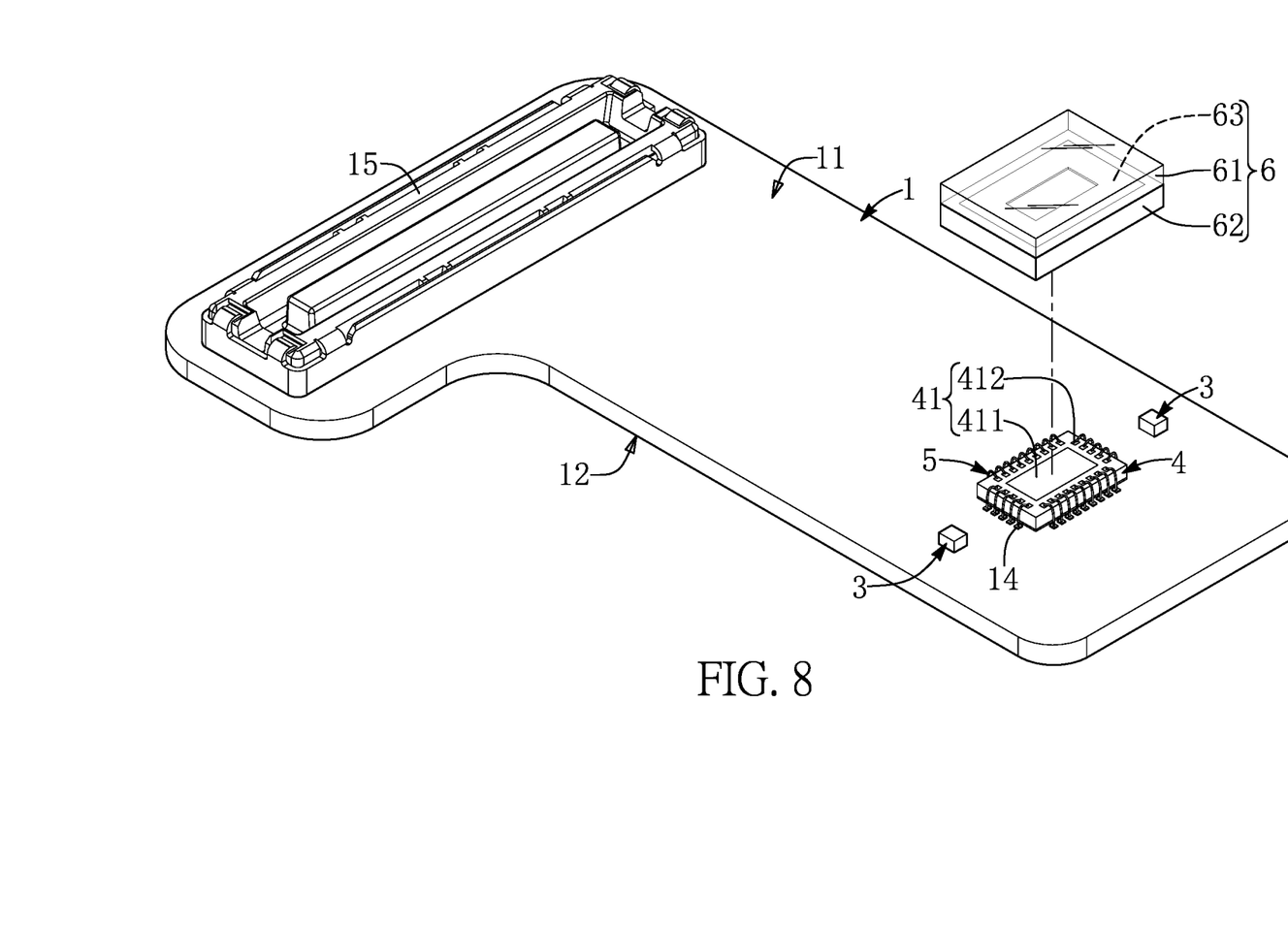
FIG. 8 is a partial exploded view of FIG. 7 when the optical module and the sealing compound are omitted.
Figure 9:
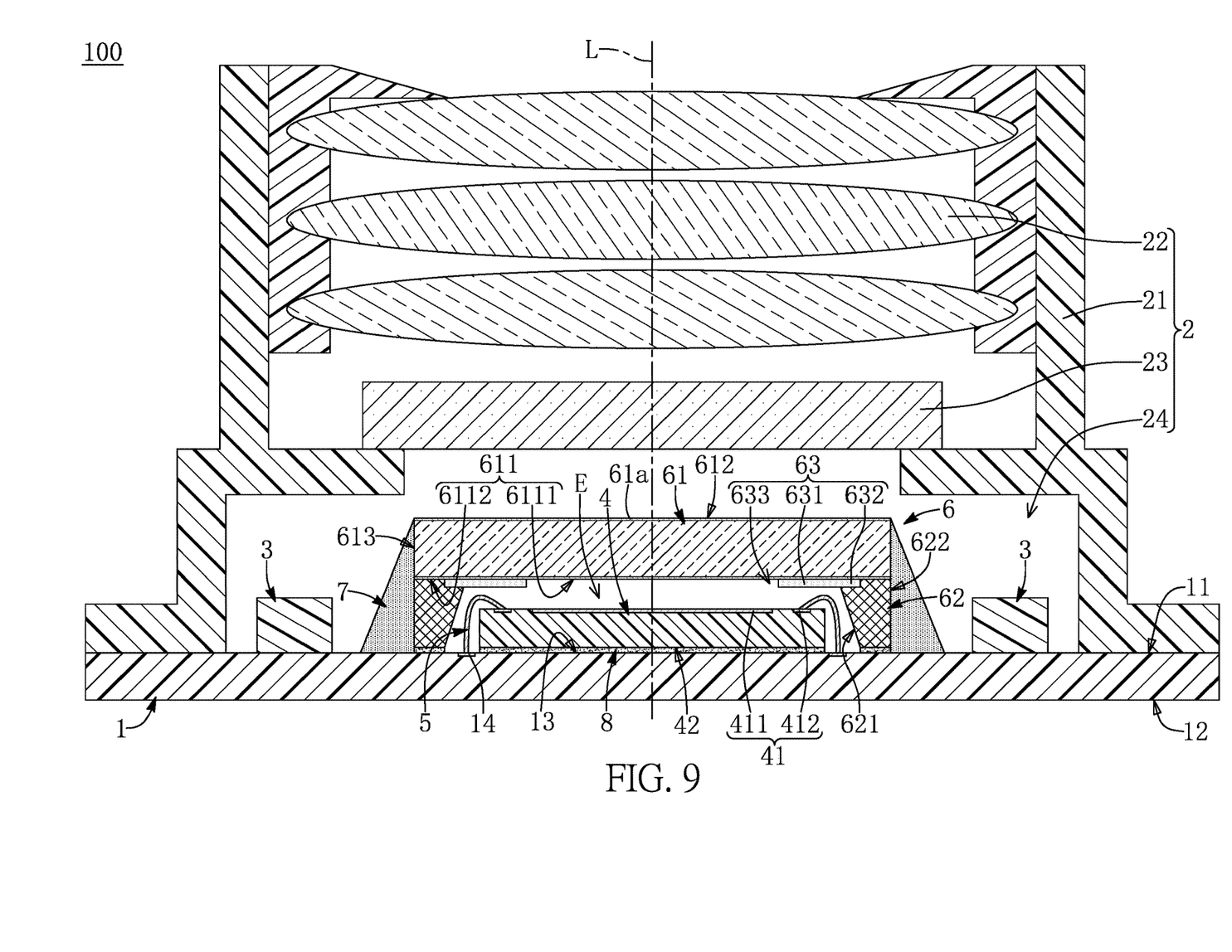
FIG. 9 is a cross-sectional view of the sensor lens assembly according to the third embodiment of the present disclosure.

Referring to FIG. 7 to FIG. 9, a third embodiment of the present disclosure is provided, which is similar to the first embodiment of the present disclosure. For the sake of brevity, descriptions of the same components in the first and third embodiments of the present disclosure will be omitted herein, and the following description only discloses different features between the first and third embodiments.

In the present embodiment, the light-permeable sheet 61 of the cover 6 is provided without the ring-shaped notch 614 (i.e., the surrounding lateral surface 613 of the light-permeable sheet 61 connects the outer surface 612 and the inner surface 611), and the sensor lens assembly 100 includes a light shielding film 63 that is opaque and that is in a ringed shape.

The light shielding film 63 is resilient and includes a shielding segment 631 and an embedded segment 632 that surrounds the shielding segment 631. The light shielding film 63 is disposed on the inner surface 611 of the light-permeable sheet 61, and the inner surface 611 is divided into a light-permeable region 6111 and a formation region 6112 by the light shielding film 63. The light-permeable region 6111 is arranged inside of the light shielding film 63, and the formation region 6112 is arranged outside of the light shielding film 63.

Moreover, the opaque frame 62 is (gaplessly) formed on the embedded segment 632 of the light shielding film 63 and the formation region 6112 of the light-permeable sheet 61. The opaque frame 62 is disposed on the first surface 11 of the circuit board 1 and outside of the bonding pads 14, so that the light-permeable sheet 61 and the sensor chip 4 are spaced apart from each other, and the sensor chip 4 and the wires 5 are arranged in a space that is jointly defined by the light-permeable sheet 61 and the opaque frame 62.

Specifically, the light shielding film 63 has an opening 633 that is defined by an inner edge of the shielding segment 631 and that is located directly above the sensing region 411. In other words, the opening 633 corresponds in position to the light-permeable region 6111. Moreover, the bonding pads 14, the connection pads 412, and the wires 5 are arranged in a projection space defined by orthogonally projecting the light shielding film 63 toward the first surface 11. In other words, the bonding pads 14, the connection pads 412, and the wires 5 are located directly under the light shielding film 63 so as to effectively avoid occurrence of a flare phenomenon.

Accordingly, the sensor lens assembly 100 provided by the present embodiment can accurately define the light-permeable region 6111 from the inner surface 611 by forming the light shielding film 63 onto the inner surface 611, and the light shielding film 63 can effectively block light from passing therethrough so as to avoid occurrence of the flare phenomenon. Moreover, during the forming process of the opaque frame 62, the light shielding film 63 can be pressed by and gaplessly connected to a mold (not shown in the drawings) through having resilient property, thereby blocking the opaque frame 62 from extending to the light-permeable region 6111 so as to accurately form the opaque frame 62.

Beneficial Effects of the Embodiments

In conclusion, through cooperation of the above components, the sensor lens assembly provided by the present disclosure does not need to undergo any soldering process through the non-soldering configuration thereof, such that requirements for high-temperature resistance of component connections in the distribution space (e.g., connections between any two of the sensor chip, the wires, the cover, and the sealing compound) can be lowered. Accordingly, a material cost of the sensor lens assembly can be decreased, and the product yield of the sensor lens assembly can be increased. Specifically, since the sensor lens assembly of the present disclosure does not need to go through a soldering process, the sensor lens assembly does not need to be subjected to relevant testing processes, thereby effectively simplifying the entire production process to improve the production efficiency of the sensor lens assembly.

Moreover, the light-permeable sheet of the sensor lens assembly provided by the present disclosure is in cooperation with the opaque frame through the ring-shaped notch, thereby effectively reducing a probability of a fluid (e.g., the sealing compound or moist) flowing into the cover by passing through connection between the light-permeable sheet and the opaque frame.

In addition, the sensor lens assembly provided by the present disclosure can accurately define the light-permeable region from the inner surface by forming the light shielding film onto the inner surface, and the light shielding film can effectively block light from passing therethrough so as to avoid occurrence of a flare phenomenon. Moreover, during the forming process of the opaque frame, the light shielding film can be pressed by and gaplessly connected to a mold through having the resilient property, thereby blocking the opaque frame from extending to the light-permeable region so as to accurately form the opaque frame.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor lens assembly having a non-soldering configuration, comprising:
    a circuit board having a first surface and a second surface that is opposite to the first surface, wherein the first surface of the circuit board includes a chip-bonding region and a plurality of bonding pads that are arranged outside of the chip-bonding region;
    an optical module including:
        a frame fixed on the first surface of the circuit board;
        at least one lens assembled into the frame, wherein a central axis of the at least one lens passes through the chip-bonding region; and
        a filtering sheet assembled into the frame and positioned along the central axis, wherein the frame and the filtering sheet jointly define a distribution space, and the chip-bonding region and the bonding pads are arranged in the distribution space;
    a sensor chip including a sensing region arranged on a top surface thereof and a plurality of connection pads that are arranged on the top surface and outside of the sensing region, wherein the sensor chip is disposed on the chip-bonding region, and the sensing region is positioned along the central axis;
    a plurality of wires, wherein the bonding pads are respectively and electrically coupled to the connection pads through the wires; and
    a cover arranged in the distribution space and including:
        a light-permeable sheet having two anti-reflection films that are respectively coated on two opposite sides thereof and that respectively define an inner surface and an outer surface, wherein the light-permeable sheet has a ring-shaped notch recessed in an edge of the inner surface, and the two anti-reflection films are not arranged in the ring-shaped notch; and
        an opaque frame formed on the ring-shaped notch, wherein the opaque frame is disposed on the first surface of the circuit board, the light-permeable sheet and the sensor chip are spaced apart from each other, and the sensor chip and the wires are arranged in a space that is defined by the light-permeable sheet and the opaque frame, and wherein the opaque frame does not cover the inner surface of the light-permeable sheet.

2. The sensor lens assembly according to claim 1, wherein the opaque frame has an inside surface and an outside surface that is coplanar with a surrounding lateral surface of the light-permeable sheet, and a part of each of the wires is arranged in a projection space defined by orthogonally projecting the inside surface toward the first surface of the circuit board.

3. The sensor lens assembly according to claim 2, further comprising a sealing compound arranged in the distribution space, wherein the sealing compound covers and is connected to the outside surface of the opaque frame and the surrounding lateral surface of the light-permeable sheet, and the outer surface of the light-permeable sheet is exposed from the sealing compound.

4. The sensor lens assembly according to claim 1, wherein the ring-shaped notch has a longitudinal depth with respect to the inner surface, and the longitudinal depth is less than or equal to 50% of a thickness of the light-permeable sheet.

5. The sensor lens assembly according to claim 1, wherein the light-permeable sheet has a surrounding lateral surface connected to the outer surface, and the ring-shaped notch has a ring-shaped tread surface and a ring-shaped riser surface, and wherein the ring-shaped tread surface is connected to the surrounding lateral surface, the ring-shaped riser surface connects the ring-shaped tread surface and the inner surface, and the ring-shaped tread surface and the ring-shaped riser surface are entirely covered by the opaque frame.

6. The sensor lens assembly according to claim 5, wherein the bonding pads are arranged at a projection area defined by orthogonally projecting the ring-shaped riser surface onto the first surface.

7. The sensor lens assembly according to claim 1, further comprising a light shielding film arranged in the ring-shaped notch, wherein the light-permeable sheet has a surrounding lateral surface connected to the outer surface, and the ring-shaped notch has a ring-shaped tread surface and a ring-shaped riser surface, and wherein the ring-shaped tread surface is connected to the surrounding lateral surface, the ring-shaped riser surface connects the ring-shaped tread surface and the inner surface, the ring-shaped tread surface and the ring-shaped riser surface are entirely covered by the light shielding film, and the light shielding film is entirely covered by the opaque frame.

8. A sensor lens assembly having a non-soldering configuration, comprising:
- a circuit board having a first surface and a second surface that is opposite to the first surface, wherein the first surface of the circuit board includes a chip-bonding region and a plurality of bonding pads that are arranged outside of the chip-bonding region;
- an optical module including:
  - a frame fixed on the first surface of the circuit board;
  - at least one lens assembled into the frame, wherein a central axis of the at least one lens passes through the chip-bonding region; and
  - a filtering sheet assembled into the frame and positioned along the central axis, wherein the frame and the filtering sheet jointly define a distribution space, and the chip-bonding region and the bonding pads are arranged in the distribution space;
- a sensor chip including a sensing region arranged on a top surface thereof and a plurality of connection pads that are arranged on the top surface and outside of the sensing region, wherein the sensor chip is disposed on the chip-bonding region, and the sensing region is positioned along the central axis;
- a plurality of wires, wherein the bonding pads are respectively and electrically coupled to the connection pads through the wires; and
- a cover arranged in the distribution space and including:
  - a light-permeable sheet having two anti-reflection films that are respectively coated on two opposite sides thereof and that respectively define an inner surface and an outer surface;
  - a light shielding film being in a ringed shape and disposed on the inner surface, wherein the light shielding film includes a shielding segment and an embedded segment that surrounds the shielding segment, wherein the inner surface is divided into a light-permeable region and a formation region by the light shielding film, and wherein the light-permeable region is arranged inside of the light shielding film, and the formation region is arranged outside of the light shielding film; and
  - an opaque frame formed on the embedded segment and the formation region, wherein the opaque frame is disposed on the first surface of the circuit board, the light-permeable sheet and the sensor chip are spaced apart from each other, and the sensor chip and the wires are arranged in a space that is defined by the light-permeable sheet and the opaque frame.

9. The sensor lens assembly according to claim 8, wherein the opaque frame has an inside surface and an outside surface that is coplanar with a surrounding lateral surface of the light-permeable sheet, and the bonding pads, the connection pads, and the wires are arranged in a projection space defined by orthogonally projecting the light shielding film toward the first surface.

10. The sensor lens assembly according to claim 8, wherein the light shielding film has an opening that is defined by an inner edge of the shielding segment and that is located directly above the sensing region.

* * * * *